United States Patent [19]
Patrick et al.

[11] Patent Number: 5,556,549
[45] Date of Patent: Sep. 17, 1996

[54] POWER CONTROL AND DELIVERY IN PLASMA PROCESSING EQUIPMENT

[75] Inventors: Roger Patrick, Santa Clara, Calif.; Frank A. Bose, Wettingen, Switzerland

[73] Assignee: LSI Logic Corporation, Milpitas, Calif.

[21] Appl. No.: 236,444

[22] Filed: May 2, 1994

[51] Int. Cl.$^6$ ................................... H05H 1/00
[52] U.S. Cl. ................. 216/61; 156/627.1; 156/345; 204/192.13; 204/192.33; 204/298.03; 204/298.32; 427/8; 118/712
[58] Field of Search ............ 216/59, 61; 156/627.1; 204/192.13, 192.33, 298.03, 298.32; 315/111.21; 333/32, 17.3; 118/723 R, 723 E, 723 ER, 723 I, 723 IR, 712; 427/8, 10, 569

[56] References Cited

U.S. PATENT DOCUMENTS 4,679,007 7/1987 Reese et al. ...................... 333/32 X
5,175,472 12/1992 Johnson, Jr. et al. ............ 315/111.21

Primary Examiner—Thi Dang
Attorney, Agent, or Firm—Katz & Cotton, LLP

[57] ABSTRACT

The present invention relates to a system and method for control and delivery of radio frequency power in plasma process systems. The present invention monitors the power, voltage, current, phase, impedance, harmonic content and direct current bias of the radio frequency energy being delivered to the plasma chamber. In addition, the plasma mode of operation may be controlled by creating either a capacitively or inductively biased radio frequency source impedance. A radio frequency circulator prevents reflected power from the plasma chamber electrode to damage the power source and it further dissipates the reflected power in a termination resistor. The termination resistor connected to the circulator also effectively terminates harmonic energy caused by the plasma non-linearities. Multiple plasma chamber electrodes and radio frequency power sources may be similarly controlled.

13 Claims, 9 Drawing Sheets

POWER CONTROL AND DELIVERY IN PLASMA PROCESSING EQUIPMENT

BACKGROUND OF THE INVENTION

This application is related to co-pending patent applications: U.S. Ser. No. 08/027,995, entitled "Coil Configurations for Improved Uniformity in Inductively Coupled Plasma Systems" by Roger Patrick, Frank Bose, Philippe Schoenborn and Harry Toda, filed Mar. 8, 1993; and U.S. Ser. No. 08/106,017, entitled "End-Point Detection in Plasma Etching by Monitoring Radio Frequency Matching Network" by Roger Patrick and Frank Bose, filed Aug. 13, 1993, both applications assigned to LSI Logic Corporation.

FIELD OF THE INVENTION

The present invention relates to plasma processing systems and, more particularly, to a method and apparatus for power control and delivery of radio frequency power in plasma process systems.

DESCRIPTION OF THE RELATED TECHNOLOGY

Ionized gas or "plasma" may be used during processing and fabrication of semiconductor devices, flat panel displays and in other industries requiring etching or deposition of materials. Plasma may be used to etch or remove material from semiconductor integrated circuit wafers, sputter or deposit material onto a semiconducting, conducting or insulating surface. Creating a plasma for use in manufacturing or fabrication processes, typically, is done by introducing a low pressure process gas into a process vessel chamber surrounding a work piece such as an integrated circuit wafer. The molecules of the low pressure gas in the chamber are ionized into a plasma by the radio frequency energy (power) source after entering the chamber, and the plasma flows over the work piece. The process vessel is used to maintain the low pressures required for the plasma and to serve as a structure for attachment of one or more radio frequency energy sources.

Plasma may be created from a low pressure process gas by inducing an electron flow which ionizes individual gas molecules by transferring of kinetic energy through individual electron-gas molecule collisions. Typically, electrons are accelerated in an electric field such as one produced by radio frequency ("RF") energy. This RF energy may be low frequencies (below 550 KHz), high frequencies (13.56 MHz), or microwaves (2.45 GHz).

Plasma etching may be performed by plasma etching or reactive ion etching (RIE). A plasma etching system consists of a radio frequency energy source and a pair of electrodes. A plasma is generated between the electrodes while the work piece, such as a semiconductor wafer, is planar with one of the electrodes. The chemical species in the plasma are determined by the source gas (es) used.

Plasma etching methods and apparatus are generally illustrated in U.S. Pat. Nos. Re. 30,505 and 4,383,885. These patents illustrate plasma etching systems. A method and apparatus for obtaining a substantially parallel (planar) plasma for processing of integrated circuit wafers is described in U.S. Pat. No. 4,948,458. A typical plasma etching system may consist of an enclosure having an interior bounded at least in part by a radio frequency transparent window. A planar coil is disposed proximate to the window, and a radio frequency energy source is coupled through an impedance matching circuit to the coil. The planar coil radiates the radio frequency energy such that a planar magnetic field is induced in the interior of the enclosure. A plasma is generated thereby from the process gas. This plasma reacts with the surface of the semiconductor wafer, etching it away.

Plasma may also be used in chemical vapor deposition (CVD) to form thin films of metals, semiconductor or insulator materials onto a work piece such as a semiconductor wafer. Plasma-enhanced CVD uses the plasma to supply the required reaction energy for deposition of the desired materials. Typically, radio frequency energy is used to produce this plasma.

Control and delivery of the power in a plasma discharge is of fundamental importance in plasma processing, including etching, sputtering and deposition systems. The most commonly used method of obtaining a predetermined radio frequency power is to use a matching network between a radio frequency power source and the plasma discharge chamber electrodes or coupling coil. The matching network transforms the impedance (capacitive reactance) of the plasma discharge into a substantially resistive load for the radio frequency power source. The power source is then set to a predetermined power level dependant upon the process parameters desired.

The matching network between the radio frequency power source and plasma chamber electrodes typically consists of variable capacitors and/or inductors as the variable matching components at low or high frequencies, and variable cavity taps or matching stubs at microwave frequencies. The matching network may be adjusted manually or automatically. Typically, the network adjusts automatically to changing etching process load conditions.

For a given etching process load condition, the matching network is adjusted so that the radio frequency generator "sees" a resistive load at its source impedance. When the etching process parameters change, as when an "end-point" to an etch process is reached, the load impedance changes. The matching network automatically adjusts to changes in the load impedance, thus maintaining a constant impedance for the radio frequency generator. A properly adjusted matching network will match the characteristic output impedance (typically 50 ohms resistive) of the radio frequency generator to the load impedance (plasma system) and cancel out any reactive (mainly capacitive) components of the load.

In present plasma systems, radio frequency power is monitored and controlled at the generator output on the assumption that the power losses in the matching network are negligible. However, radio frequency power delivered to the plasma chamber has been found to be substantially less than the generator power because of unexpected losses in the matching network. The amount of actual power in the plasma chamber greatly affects the process conditions. Significant variance in actual power delivered to the plasma chamber may unexpectedly change the anticipated contribution of other process variable parameters, such as pressure and etch rate.

Plasma is a non-linear load to the radio frequency power source. The plasma may have a highly capacitive impedance when first being formed by an E (voltage) field. During formation of the plasma, there are few free electrons and the current flow in the plasma is negligible. Free electrons in the plasma continue to increase until a quite rapid increase of free electrons occurs. Once there is a substantial number of free electrons in the plasma, thus creating a higher current flow, the plasma shifts its mode of operation from an E-field to an H-field (magnetic - current) and becomes more inductive in impedance. Plasma in the voltage or E-field mode has different properties and characteristics than when in the current or H-field mode.

Commercial matching networks do not distinguish between the different modes of the plasma, only that the load impedance to be matched has changed. Thus, the matching network may have two or more different match points for the plasma load, i.e., the voltage (E-field) mode, the current (H-field) mode or any combination thereof. Also, depending upon which match point the matching network seeks, it may force the plasma into an undesirable or unwanted mode of operation, i.e., an excessive voltage or current mode.

The purpose of the commercial matching network is to minimize the standing wave ratio ("SWR") (impedance mismatch) at the radio frequency generator power source. Therefore, when the plasma load impedance varies due to process parameter changes, the matching network may or may not force the plasma into an undesired mode of operation because the matching network only tries to reduce the SWR at the radio frequency generator.

For better control of the plasma process and more reliable and repeatable deterministic insight into the actual physical effects of process parameter changes, it would be preferable to control the characteristics of the radio frequency power delivered to the process chamber. Therefore, what is needed is a simple, reliable, and cost effective way to determine and control the radio frequency power parameters being delivered to the plasma chamber. It is therefore an object of the present invention to determine and control these radio frequency power parameters.

SUMMARY OF THE INVENTION

The present invention provides a system and method for determining and controlling the radio frequency power parameters being delivered to a plasma chamber. The present invention accomplishes this object by monitoring the power, voltage, current, phase and impedance of the radio frequency energy being delivered to the plasma chamber. In addition, the present invention may control the plasma mode of operation by creating either a capacitively or inductively biased radio frequency source impedance.

According to one aspect of the present invention, a radio frequency circulator is connected to the output of a radio frequency power generator. The circulator is used to pass the radio frequency power to a plasma chamber electrode such as, for example, a plate electrode or a planar coil. A sensor between the circulator and chamber electrode measures the radio frequency power being delivered to the plasma chamber. In addition, the sensor measures the voltage, current and phase angle at the chamber electrode, and measures the chamber impedance.

The power sensor connects to a power controller that controls the output power of the radio frequency power generator. The purpose of the circulator is to minimize the amount of reflected power and generated harmonics from the plasma chamber electrode back to the generator. A circulator is a three port device that allows radio frequency power to flow in substantially one direction only. By connecting a terminating resistor to the circulator, the reflected power and generated harmonics from the plasma chamber electrode are absorbed and dissipated in this resistor. This embodiment of the present invention comprises a simple radio frequency power delivery system for use in a plasma generating system without complex mechanical and electrical matching circuits. An advantage of this embodiment of the present invention is that accurate measurement and control of power delivery to the plasma chamber electrode is achieved.

According to another aspect of the present invention, a fixed matching network is connected between the output of the circulator and the plasma chamber electrode. This fixed matching network may be utilized to achieve a more resistive impedance for the circulator. Under high SWR conditions, the circulator must be rated for worst case circulating currents and voltages that require higher dissipation and insulation margins in the circulator components. By utilizing the fixed matching network between the circulator output and the plasma chamber electrode, the circulator is not required to handle as high an SWR and does not need to withstand as wide a variation of voltage and current magnitudes.

Plasma has a nonlinear load impedance. To create a plasma, normally, a high potential electric field is utilized. This electric field is generated between the plasma chamber electrodes. The electrodes, in this case, have mainly a capacitive impedance. The plasma characteristics may be changed (i.e., going from the E-field mode to the H-field mode) by making the magnetic or H-field more predominant than the voltage or E-field produced between the plasma chamber electrodes. Switching from the E-field mode to the H-field mode may be accomplished by controlling the radio frequency power source impedance parameters while the free electrons are increasing in the plasma.

When first starting a plasma field, the voltage component of the delivered power may be maximized to produce the highest E-field possible between the chamber electrodes. Once the plasma field is established, then the RF power source impedance may be adjusted to maximize the current or H-field present as the number of free electrons in the plasma significantly increases. According to an aspect of the present invention, an adjustable matching and parameter network may be utilized to control the E-field and H-field parameters of the plasma chamber electrodes while matching the impedance of the electrodes to the radio frequency power generator.

The present invention may utilize a sensor at the plasma chamber electrode such that the voltage, current, phase angle between the voltage and current, power and impedance of the plasma system, and harmonic content can be readily determined. This information may be used for input parameters in controlling a matching network. In addition, this information may be used to determine and control the plasma parameters such as, for example, the E-field or H-field modes, or any combination thereof. Depending on the process step to be performed, control of the E-field voltage magnitude may be important to prevent damage to a voltage sensitive area of a work piece, such as an insulated gate of a field effect transistor. On the other hand, when a high energy potential is advantageous, the E-field may be maximized for the particular process step.

The sensor at the plasma chamber electrodes may be utilized with a programmable computer, such as a microprocessor, that may be pre-programmed with the desired parameter values for a given process. In effect, a software program, having the functional equivalent of a Smith Chart, may be utilized to calculate the most desirable match point, and the best combination of matching network parameters to achieve that match point. This enables more consistent results in the overall plasma system process. In addition, more than one process type may be programmed. It is therefore an advantage of the present invention to easily handle various different processes with a standardized general plasma generating system.

A circulator may also be utilized with the adjustable matching and parameter network. An advantage of the present invention in utilizing a circulator is that a more constant load may be presented to the radio frequency power generator, and any reflected power caused by SWR from the adjustable matching and parameter network may be dissipated in a load resistor connected to the circulator that may dissipate the reflected power. In addition, the circulator may terminate harmonics generated by the non-linear plasma load.

When using the parameter network to change the plasma mode from an E-field to an H-field or any combination thereof, an increase in the SWR and reflected power may result. Placing the circulator between the parameter network and the radio frequency signal power generator reduces the high SWR and undesirable reflected power that would normally be present at the generator output. In addition, harmonics generated by the non-linear plasma load may be effectively terminated by the circulator.

In a further embodiment of the present invention, a second matching network may be placed between the signal generator and first parameter network. This embodiment may be utilized with or without one or more circulators. The purpose of the second matching network is to present a matched load impedance to the radio frequency source (signal generator) under varying impedance matching (and E or H field forcing) conditions of the first parameter network.

By having a radio frequency parameter measurement sensor at the plasma chamber and knowing the matching parameters of a matching network, the present invention may easily calculate the best matching parameters for a desired process condition. A computer based measurement and control system may be easily programmed to calculate the required amounts of matching network values to properly compensate the chamber electrodes to the radio frequency source. Complex conjugate matching having a plurality of match conditions may be selected by utilizing Smith Chart calculations as is well known to those skilled in the art of radio frequency impedance matching systems.

An advantage to pre-programming the matching network to a desired plasma impedance is that the matching network very quickly matches without extended searching for a desired match position. This also reduces the possibility of a false match or a matching condition that is not desirable from a mode selection standpoint. Some etching process steps must have the voltage potential controlled through the work piece, such as when etching an insulated gate field effect transistor. Other process steps may require a large voltage potential or E-Field.

The present invention is not limited to just one chamber electrode. A plurality of electrodes may be matched to achieve the desired process parameters. Two or more electrodes may have the radio frequency power sources in frequency synchronization, but with different phase and power levels. By utilizing computer measurement and control with appropriately placed radio frequency sensors, the present invention can precisely control all variable parameters in a chamber and anticipate desired matching conditions rapidly, so as to minimize potentially damaging variations in the process parameters. The radio frequency sensors may be located at the chamber, between or before the matching networks, and at the output of the radio frequency source. In this way, all variable parameters may be monitored and appropriate actions taken to properly compensate for a desired result.

An object of the present invention is to efficiently transfer power from the radio frequency generator to a plasma chamber electrode while minimizing reflected power and harmonics returning back to the radio frequency source.

An advantage of the present invention is that the power delivered to the process chamber is closely controlled at the desired power level, and unpredictable power losses in the matching network are no longer a factor in the plasma process.

Another advantage of the present invention is that the power delivered to the plasma chamber electrodes is more repeatable and controllable during various process steps.

Still another advantage is that any variation in the plasma field impedance will be more easily detected, and any required power correction may be immediately implemented.

An advantage of the present invention is the efficient termination of radio frequency harmonics caused by the non-linear plasma load.

Another advantage is better control of the plasma process, and more reliable and repeatable deterministic insight into the actual physical effects of process parameter changes by controlling the characteristics of the radio frequency power delivered to the process chamber.

Still another advantage is rapid and resettable control of the matching networks by means of computer control so as to minimize the time required to match the radio frequency signal source to the chamber electrodes.

A further advantage is that the matching network may be fine-tuned to match the actual chamber load impedance without excess hunting or possible match conditions.

A feature of the present invention is that the matching network may be utilized to selectively maximize the voltage field or the current field. In addition, the voltage or current magnitudes and associated power levels may be limited so as to reduce the possibility of damage in the process step such as, for example, when etching integrated circuits that may be damaged by an excessive voltage gradient. Thus, the present invention allows an improvement in the plasma system process due to increased accuracy and repeatability through better control of the process variables.

Other and further objects, features and advantages will be apparent from the following description of presently preferred embodiments of the invention, given for the purpose of disclosure and taken in conjunction with the accompanying drawings.

DESCRIPTION OF PREFERRED EMBODIMENTS

Figure 1:
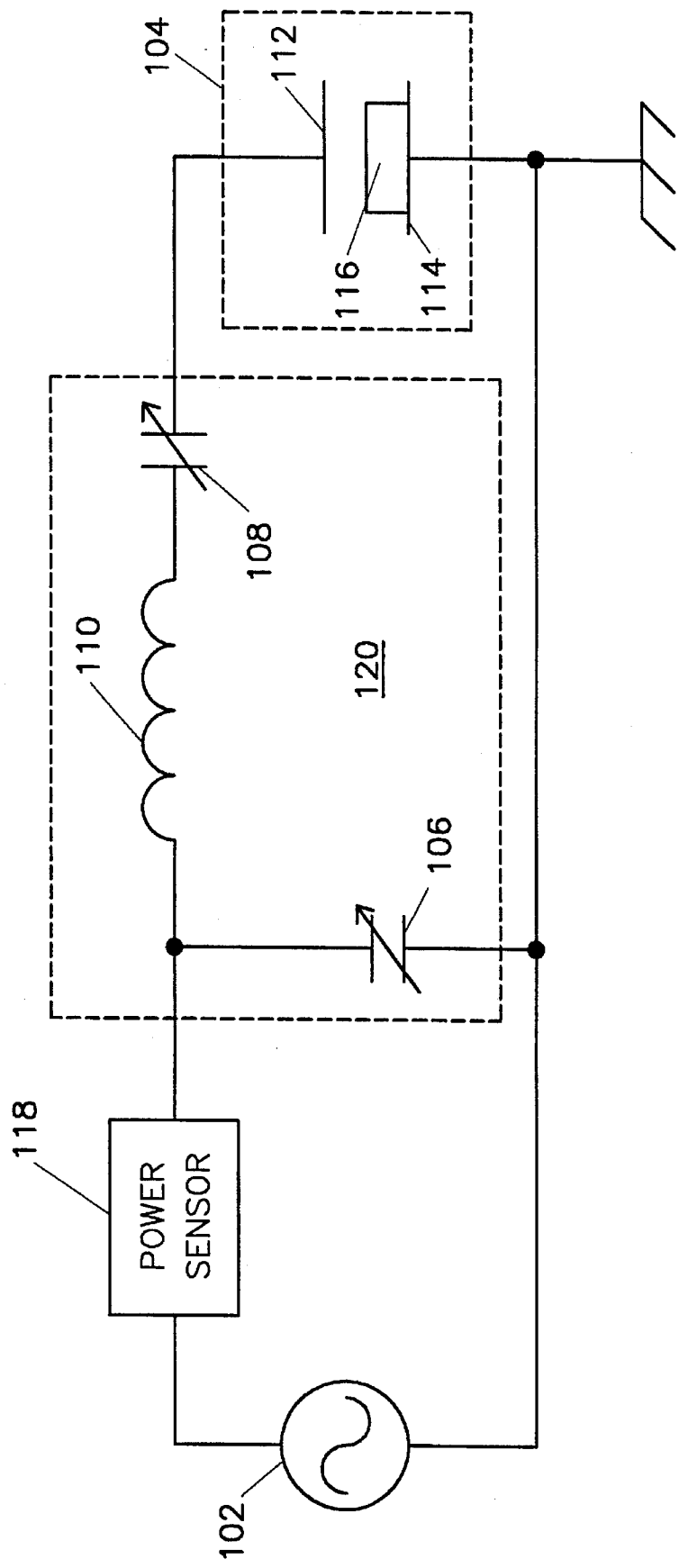
FIGS. 1 and 2 are schematic block diagrams of prior art RF plasma etching systems.

Referring now to the drawings, the details of preferred embodiments of the present invention are schematically illustrated. Like elements are numbered the same, and similar elements are represented by the same number and a different lower case letter suffix.

Referring now to FIG. 1, a prior art system for plasma etching a semiconductor wafer is illustrated schematically. A radio frequency ("RF") source 102 is coupled to a plasma chamber 104 through a matching network 120 consisting of variable capacitors 106 and 108, and coil 110. The plasma chamber 104 includes electrodes 112 and 114. A semiconductor wafer 116 is in planar communication with the electrode 114. An RF excitation field is created between the electrodes 112 and 114, and when a process gas or gases (not illustrated) is introduced into the plasma chamber 104, the gas turns into a plasma. The plasma reactively etches the surface of the semiconductor wafer 116.

Maximum transfer of RF power from the RF source 102 to the plasma chamber 104 electrodes 112 and 114 results when the plasma chamber 104 load impedance is matched to the impedance of the RF source 102. The values of coil 110 and variable capacitors 106 and 108 are selected for an appropriate impedance transformation between the RF source 102 and the plasma chamber 104 electrodes 112 and 114. Variable capacitors 106 and 108 may be automatically adjusted to obtain a substantially resistive termination for the RF source 102. Output power of the RF source 102 may be measured by a power sensor 118.

Figure 2:
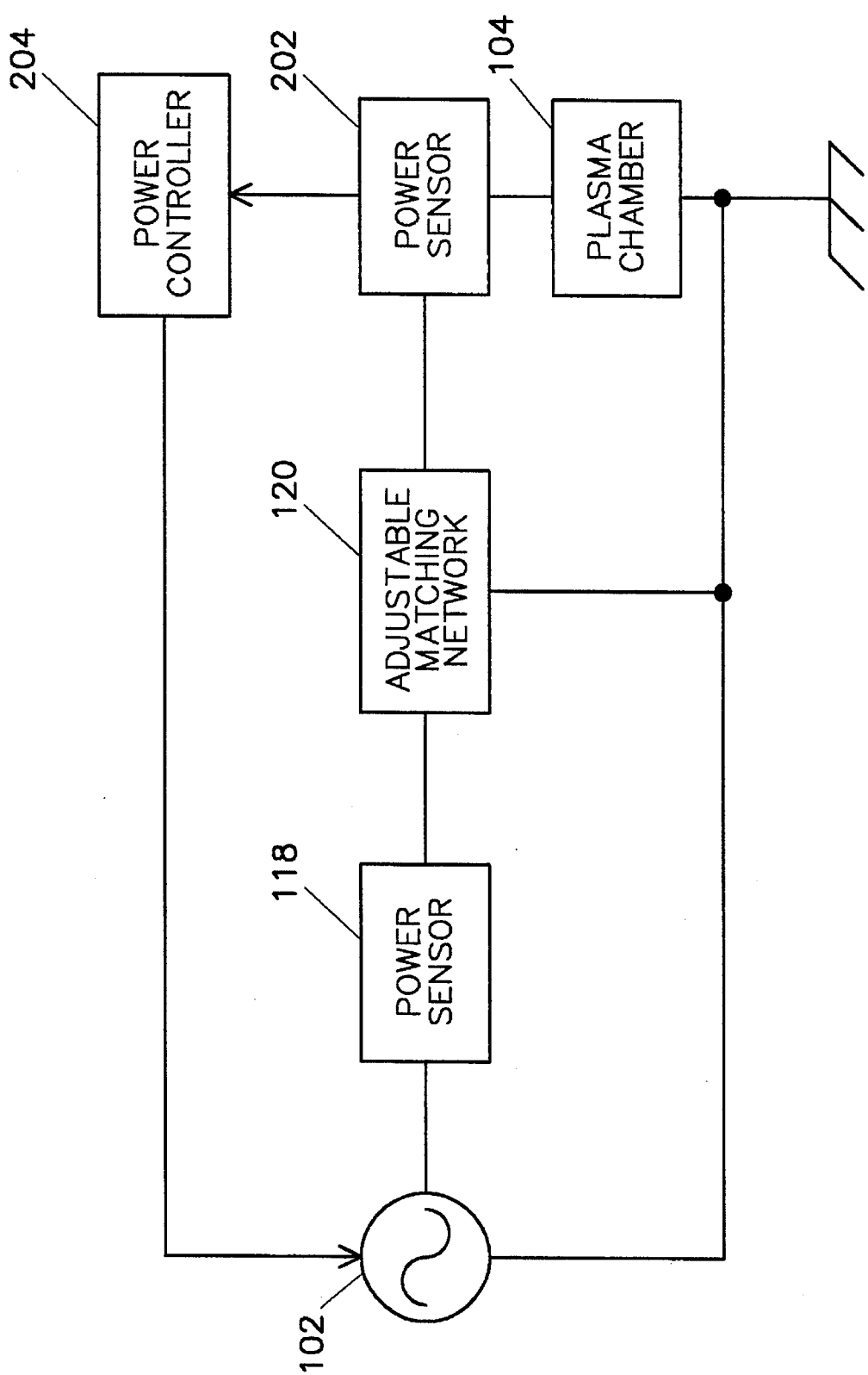

Referring now to FIG. 2, a schematic block diagram of another prior art plasma system is illustrated. The plasma system illustrated in FIG. 2 is more fully described in an article by Paul Rummel, *Monitoring and Control of RF Electrical Parameters Near Plasma Lodes*, Industrial Heating, May 1991. This plasma system is very similar to the system illustrated in FIG. 1 above, however, a power sensor 202 and a power controller 204 have been added to the component parts of the aforementioned plasma generating system.

The power sensor 202 measures the radio frequency power being delivered to the plasma chamber. The power controller 204 utilizes a signal representative of the measured power from the power sensor 202 to control the amount of power from the RF source 102. Matching network 120 automatically adjusts to produce a match condition between the RF source 102 and the plasma chamber 104.

An advantage in measuring and controlling the power at the plasma chamber is that a more uniform plasma process results because the widely varying power losses through the matching network 120 are no longer a factor.

Figure 3:
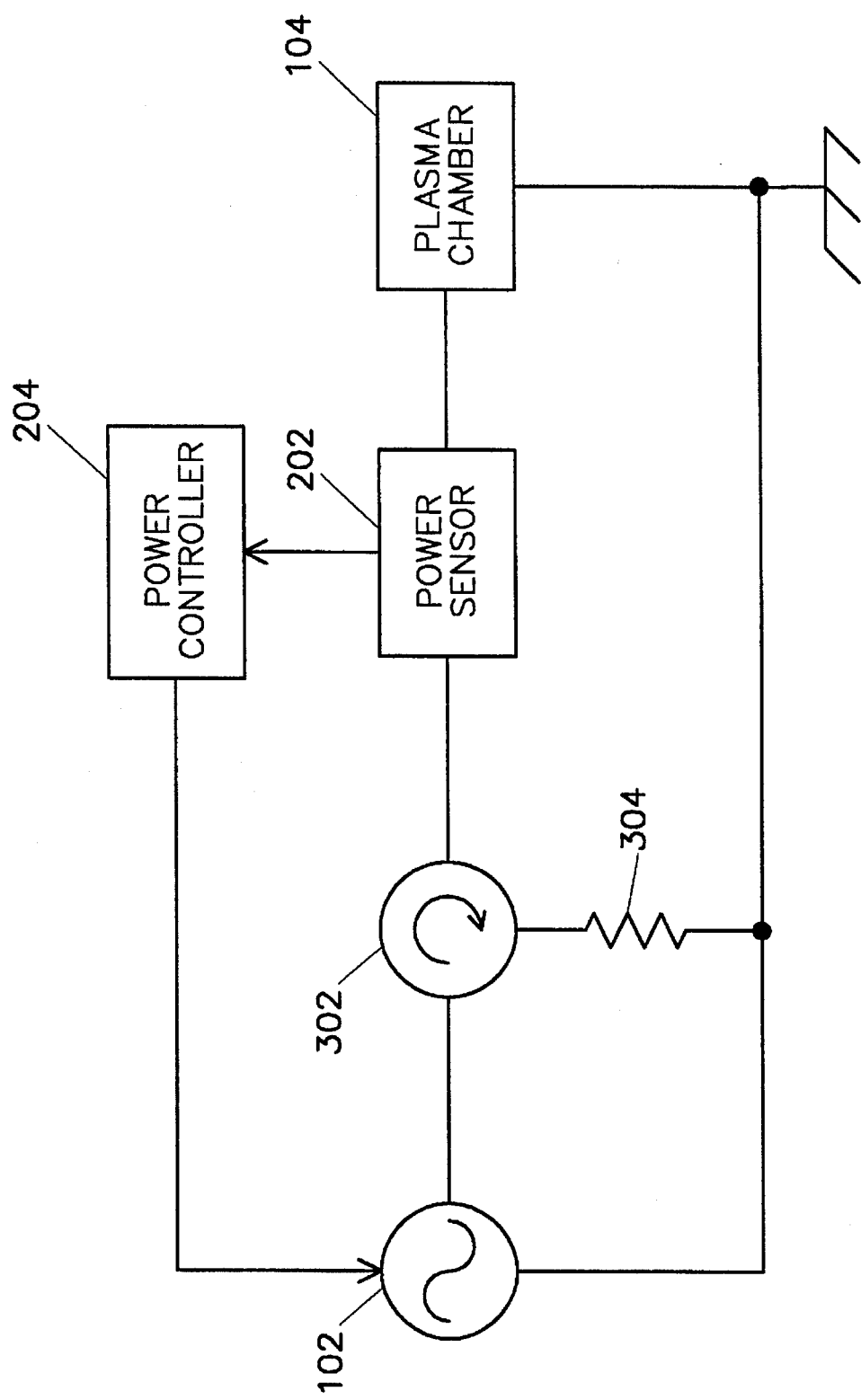
FIGS. 3, 4, 5, 6, 7, 8, and 9 are schematic block diagrams of embodiments of the present invention.

Referring now to FIG. 3, a schematic block diagram of a preferred embodiment of the present invention is illustrated. The output of RF source 102 is connected to a radio frequency circulator 302. One output port of the circulator 302 connects to the plasma chamber 104 through the power sensor 202. A termination resistor 304 connects to another port of circulator 302. A termination resistor 304 absorbs substantially all of the reflected power caused by a high standing wave ratio ("SWR") and harmonics from the plasma chamber 104 reactive and non-linear impedance. The purpose of circulator 302 is to present a more uniform load to the RF source 102 without the need of an adjustable matching network 120 (FIG. 1). Power to the plasma chamber 104 is monitored by power sensor 202 and closely controlled by means of the power controller 204 which controls the output of the RF source 102. This embodiment of the present invention is simple, reliable and has no moving parts. Power to the plasma chamber 104 is precisely controlled without introducing unknown power losses caused by varying transfer efficiencies of the matching networks when used over the range of impedance matching adjustments required during the plasma process step.

Figure 4:
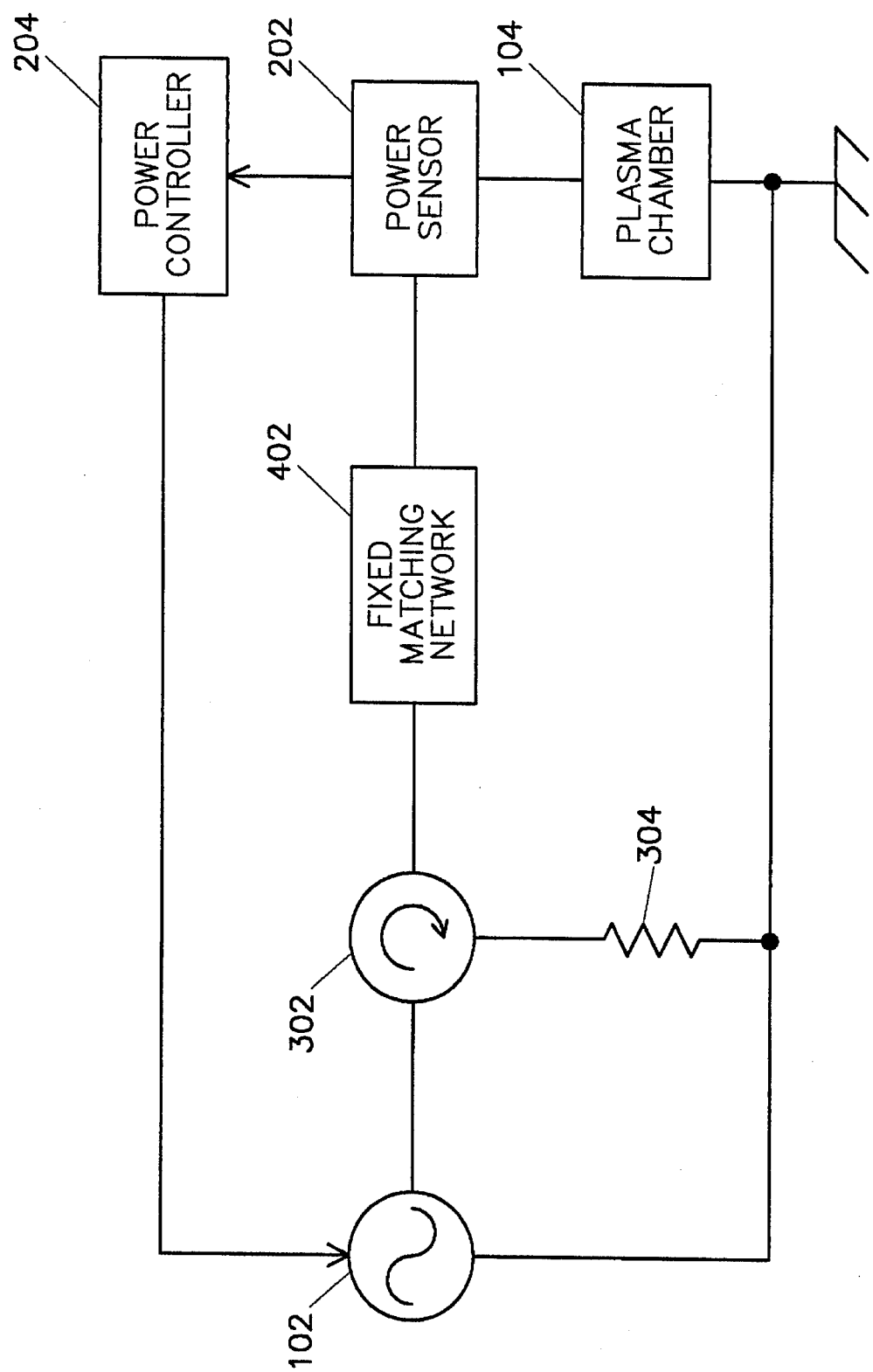

Referring now to FIG. 4, a schematic block diagram of another embodiment of the present invention is illustrated. A fixed matching network 402 is added between the circulator 302 and the power sensor 202. The purpose of the fixed matching network 402 is to create a more resistive impedance for the circulator 302. For plasma processes having well defined characteristic load impedances, the fixed matching network 402 may be preconfigured so that the circulator 302 is not required to handle such a wide extreme of voltage and current that may be present over the operating range of the plasma system.

Various fixed matching networks 402 may be selected for respective plasma system process steps. The circulator 302 of this embodiment also substantially reduces the amount of reflected power back to the RF source 102 by substantially dissipating the reflected power caused by a high SWR from the fixed matching network 402 and plasma chamber 104 into the termination resistor 304. In addition, the circulator 302 and termination resistor 304 similarly terminate harmonics generated by the non-linear plasma load.

An advantage of this embodiment of the present invention is that precise control of the power to the plasma chamber may be maintained without having to deal with variable and unknown losses in the circulator 302 and fixed matching network 402.

A further advantage of the embodiment illustrated in FIG. 4 is that a smaller circulator 302 may be utilized because the impedance mismatch is not as great as would be without using the fixed matching network 402.

Figure 5:
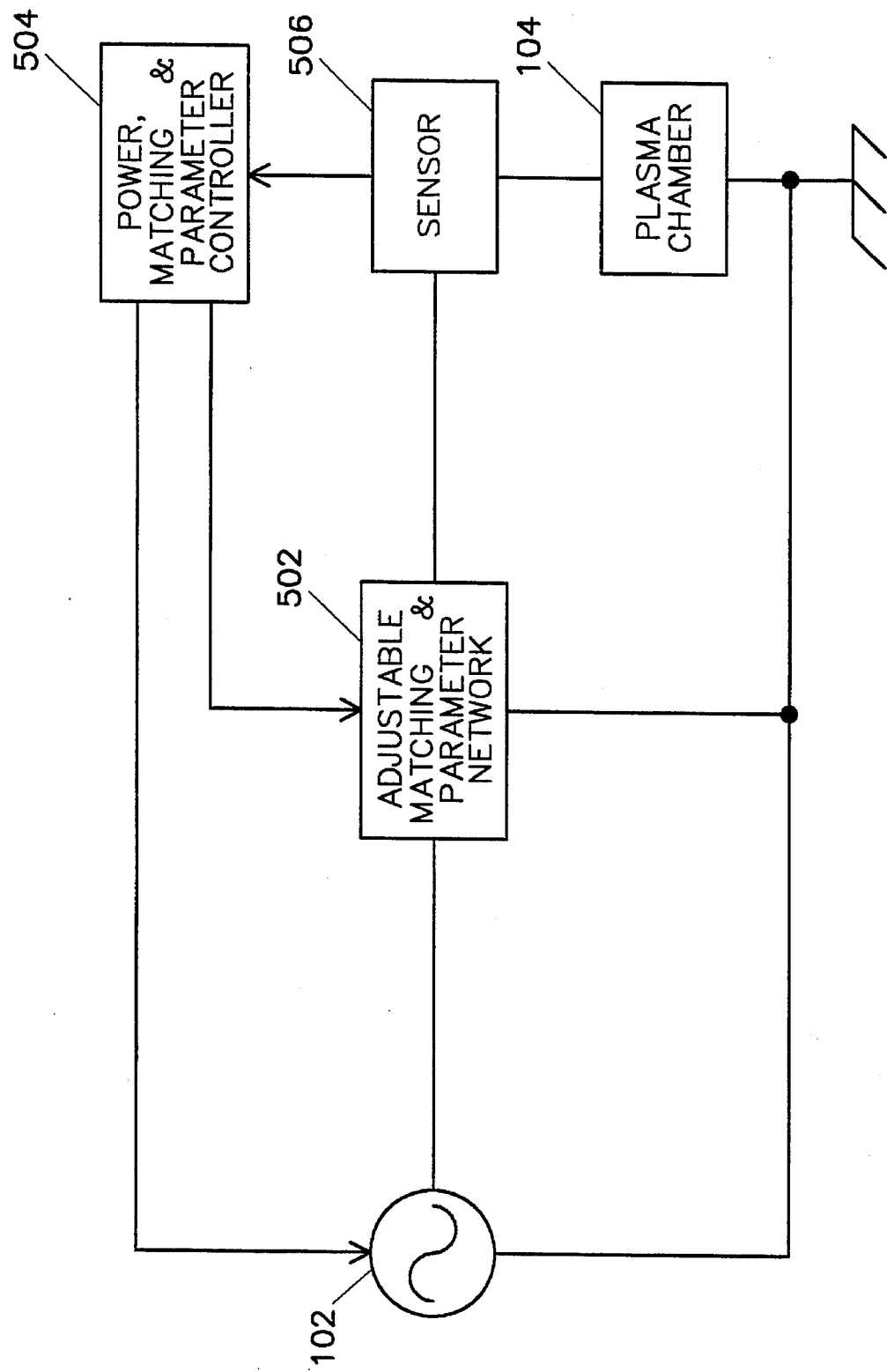

Referring now to FIG. 5, a schematic block diagram of another embodiment of the present invention is illustrated. An adjustable matching and parameter network 502 is connected between the RF source 102 and radio frequency power sensor 506. The power sensor 506 is adapted to measure voltage, current, phase angle between voltage and current, power and impedance of the electrodes in the plasma chamber 104. A power matching and parameter controller 504 utilizes the voltage, current, phase angle, power and impedance measurement values derived from power sensor 506 to control the adjustable matching and parameter network 502 and control the power output of the RF source 102. The parameter controller 504 may be a microprocessor-based computer system having programmable control features. The parameter controller 504 may directly calculate the desired matching parameters for parameter network 502. Thus, rapid matching without false settings or out of process specification range may be readily obtained on a consistent and repeatable basis.

The programmable power and parameter control system (parameter controller 504 and power sensor 506) may be specifically configured for various plasma process parameters. This enables the adjustable matching and parameter network 502 to be pre-programmed to the most desirable operating condition for the process step desired. More precise control of the power delivered to the plasma chamber 104 results when the power is measured at the plasma chamber.

An advantage in knowing the voltage, current, phase angle and impedance parameters of the plasma chamber enables better control of the plasma process parameters. The adjustable matching and parameter network 502 may be easily controlled to move the plasma mode from an E-field to an H-field or any combination thereof. This may be done by simply adjusting the matching network from a mostly capacitive conjugate match to more inductive coupling so that the predominate mode of the plasma moves from the E-field to the H-field. In this way, plasma may be initiated first by utilizing the more capacitive E-field mode and then, during the process steps, by changing the plasma to its H-field mode by making the power source impedance more inductive (greater free electrons, i.e., larger current).

Being able to reliably select plasma modes between the E-field and H-field allows more latitude in obtaining the most desirable process characteristic for an intended use of the system. Thus, an advantage of the present invention is that when dealing with a non-linear plasma impedance, selection between the E-field and H-field is easily accomplished by controlling the RF power source impedance so that either the E-field or H-field is favored by changing the capacitive or inductive reactance component of the power source to the discharge plasma load.

The present invention may readily characterize a matching network transfer function by the position of its variable capacitors (106 and 108 of FIG. 1) having position sensors thereon (not illustrated). The discharge impedance of the plasma flow may thus be correlated to the pre-programmed adjustable matching and parameter network 502 impedance by calculation or experiment for the required variable capacitor 106 and 108 positions. Calculation may be done through a computer system utilizing a Smith Chart type of software program.

The power sensor 506 may have the capability of measuring harmonic power content. By knowing the harmonic content, a more efficient matching scheme may be utilized for the desired plasma system process conditions.

Figure 6:
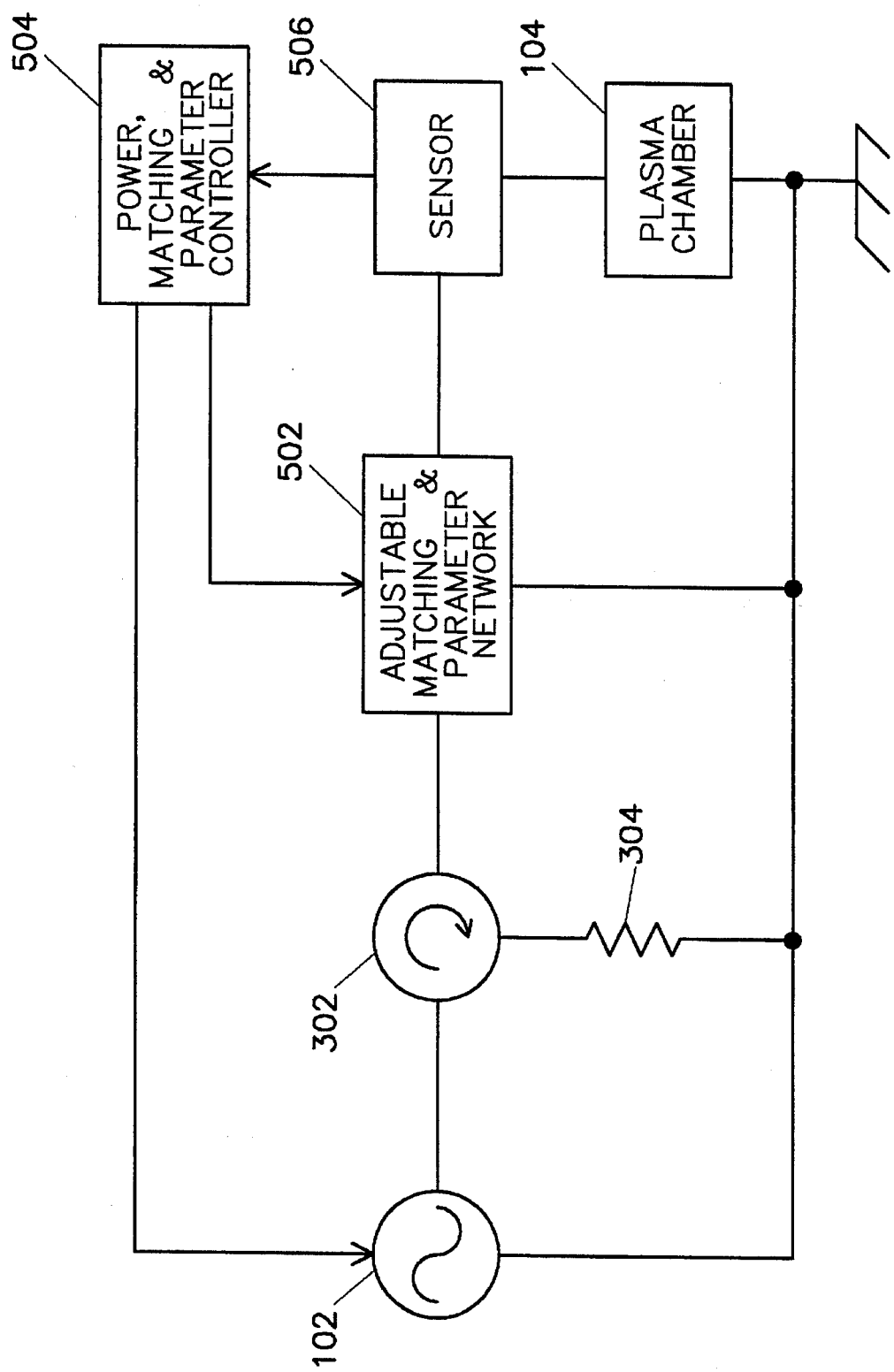

Referring now to FIG. 6, a schematic block diagram of a further embodiment of the present invention of FIG. 5 is illustrated. The circulator 302 is added between the RF source 102 and the adjustable matching and parameter network 502. Termination resistor 304 is connected to the circulator 302 to absorb and dissipate substantially all of any reflected power and harmonics from the plasma chamber 104 and the adjustable matching and parameter network 502. The circulator 302 presents a more uniform load to the RF source 102 and also allows an efficient means of terminating any harmonic power reflected from the plasma chamber 104 electrodes through the adjustable matching and parameter network 502 to termination resistor 304.

Figure 7:
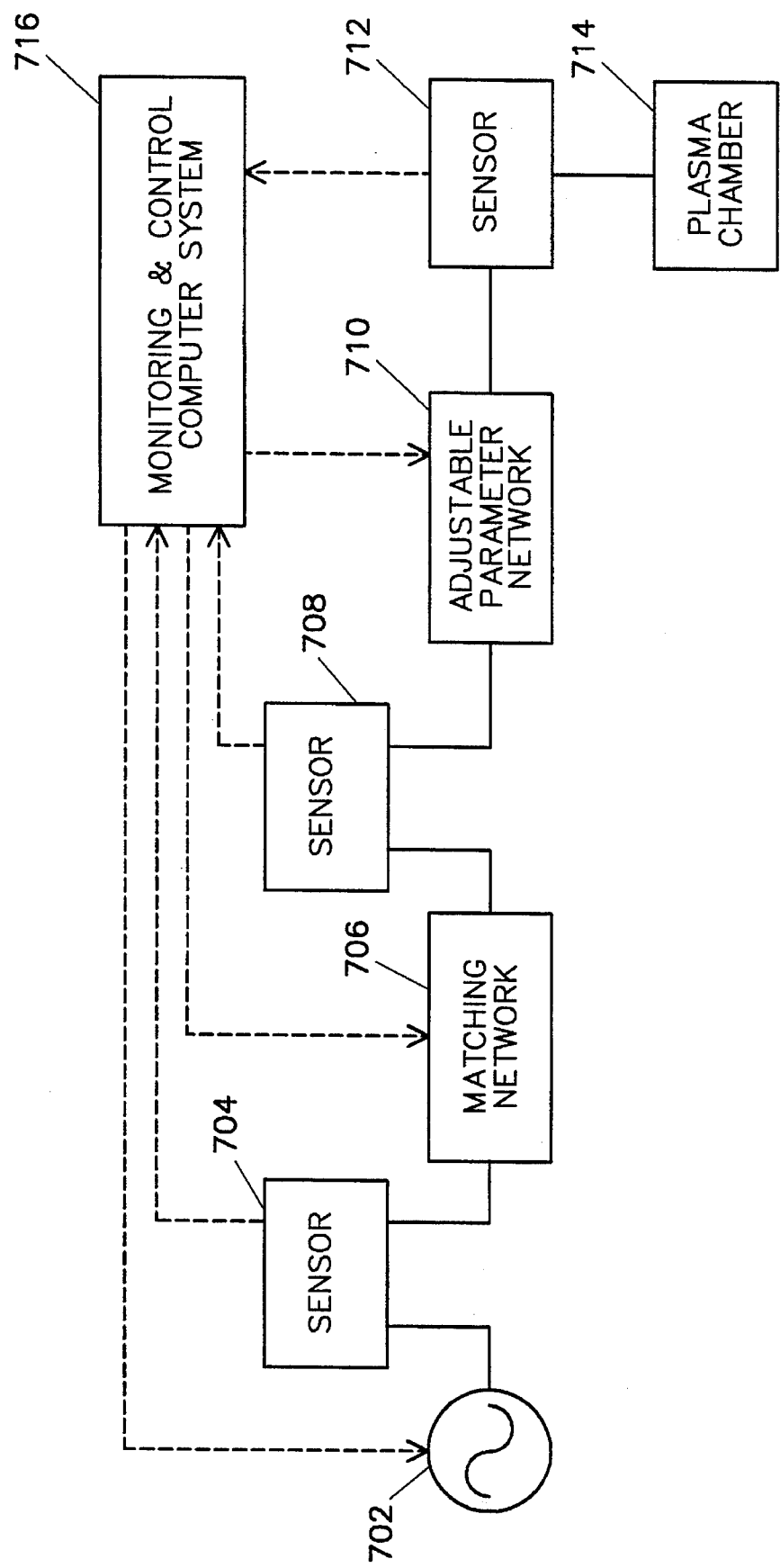

Referring now to FIG. 7, a schematic block diagram of yet another embodiment of the present invention is illustrated. The plasma system of FIG. 7 may have a matching network 706 and a parameter network 710 that may be independently adjustable by a monitoring and control computer system 716. The parameter network 710 is utilized to adjust the chamber operating parameters such as being in the E-field or H-field mode or any combination therebetween. The matching network 706 is used to create a resistive load to the RF source 702. Sensors 704, 708 and 712 are utilized to measure the various RF parameters so that the computer system 716 may correctly control the RF source 702, matching network 706 and parameter network 710. The plasma system of FIG. 7 may be used to independently control both plasma chamber 714 mode parameters and the load impedance seen by the RF source 702.

Figure 8:
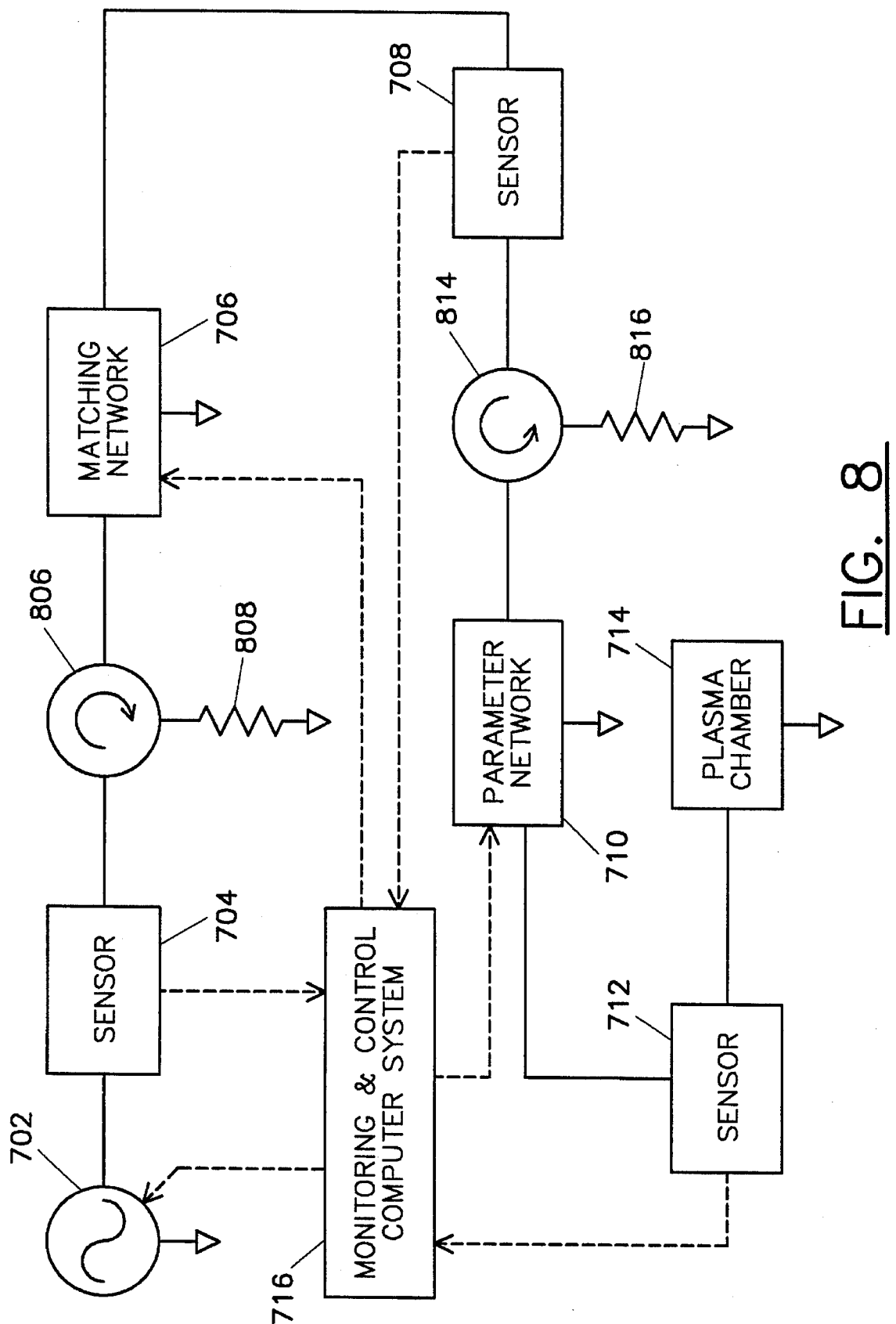

Referring to FIG. 8, another preferred embodiment of the present invention is illustrated in schematic block diagram. The system of FIG. 8 is similar to the system illustrated in FIG. 7 with the addition of circulators 806 and 814, and termination resistors 808 and 816. The purpose of the circulators 806 and 814, and termination resistors 808 and 816 is to effectively terminate any reflected power or harmonics present at the inputs of the matching network 706 and parameter network 710, respectively. All control and monitoring functions may be as described above.

Figure 9:
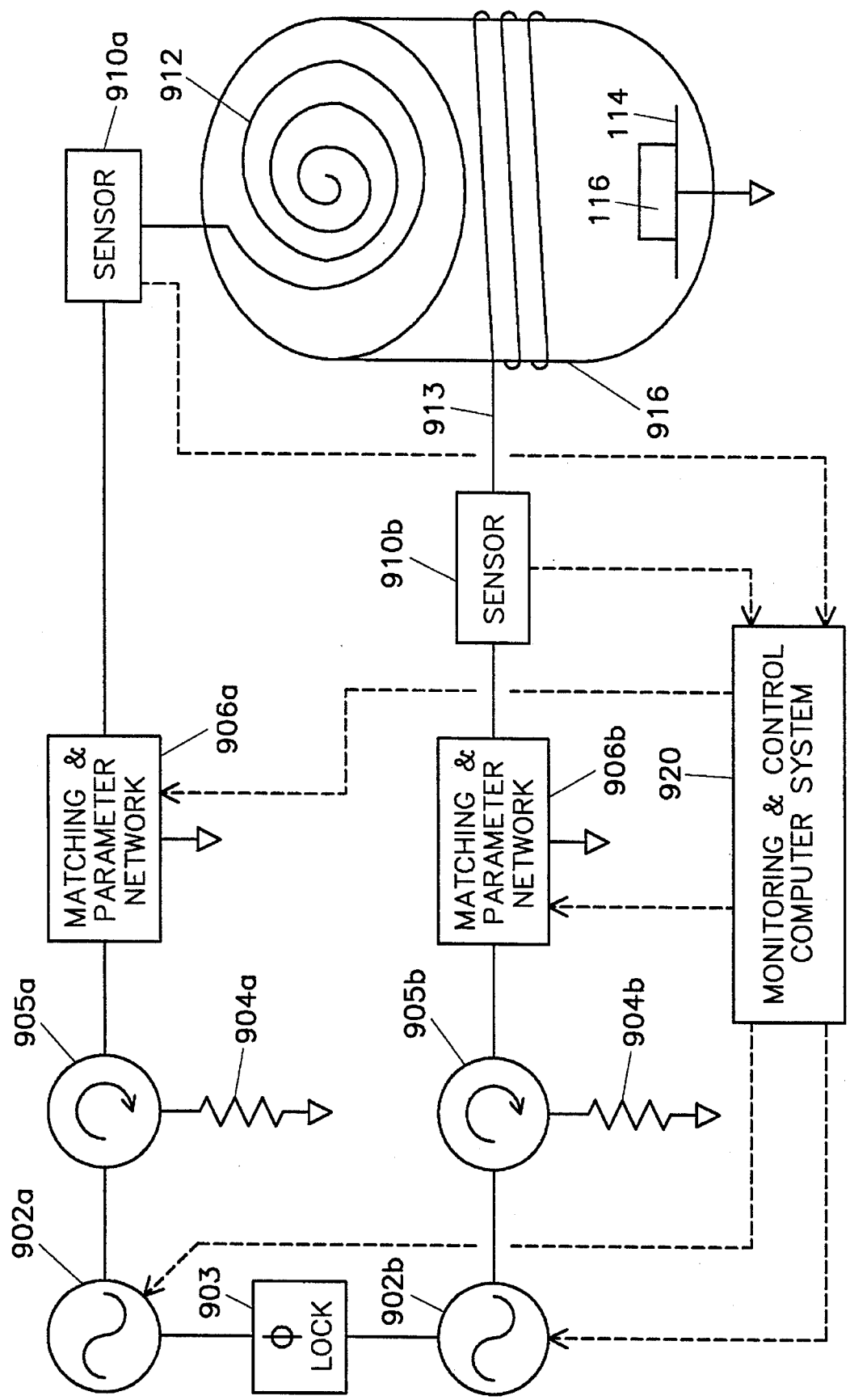

Referring to FIG. 9, a preferred embodiment of the present invention having a plasma chamber 916 with multiple electrodes 912 and 913, is illustrated in schematic block diagram. All of the above mentioned embodiments of the present invention may be utilized with a plasma chamber having a plurality of electrodes.

The multiple electrode plasma system of FIG. 9 may have a plurality of RF sources 902a and 902b which may be phase locked in frequency together with phase lock controller 903. The output of RF sources 902a and 902b may be connected to circulators 905a and 905b which terminate any reflected power and harmonics in termination resistors 904a and 904b. The plasma chamber 916 electrodes 912 and 913 connect to sensors 910a and 910b. The sensors 910a and 910b also connect to the matching and parameter networks 906a and 906b which, in turn, are connected to the circulators 905a and 905b.

The purpose of the circulators 905a and 905b, and the parameter networks 906a and 906b is for proper matching and control of the RF parameters to the plasma chamber 916 electrodes 912 and 913 as described above. The monitoring and control computer system 920 may be a computer system that independently controls the power of each of the RF sources 902a and 902b, and the matching parameters of the parameter networks 906a and 906b. The sensors 910a and 910b allow the computer system 920 to set the plasma system of FIG. 9 to the desired process parameters.

Monitoring of the power, voltage, current, phase angle between the voltage and current, impedance and harmonics at the plasma chamber electrodes enables an easy determination of the critical process parameters in a plasma system such as, for example, determination of end point detection. In addition, precise control of the delivered power to the plasma, detection and control of the plasma field mode, and the direct current bias on the work piece electrode enables more accurate and repeatable plasma process steps. A plurality of plasma chamber electrodes may be monitored and controlled as described above.

Commercially available equipment for the above mentioned sensors and controllers may be, for example, Real Power Monitor (RPM-1) produced by Comdel, Inc., Beverly Airport, Beverly Mass. 01915; and for just the sensor, a 13.56 MHz RF probe manufactured by Advanced Energy Industries, Inc., 1600 Prospect Parkway, Fort Collins, Colo. 80525.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A method for measuring and controlling process parameters in a plasma processing system, said method comprising the steps of:

monitoring power, voltage, current, phase angle between the voltage and current, direct current bias, harmonic content and impedance at a plasma chamber electrode; and controlling the output of a radio frequency power source so as to maintain desired values for the power, voltage, current, phase angle between the voltage and current, direct current bias, harmonic content and impedance at the plasma chamber electrode.

2. The method of claim 1, further comprising the step of controlling a plasma mode.

3. The method of claim 1, further comprising the step of controlling the desired values of the voltage and current at the plasma chamber electrode.

4. A plasma processing system including a radio frequency power source and plasma chamber having a radio frequency electrode, said system comprising:

a radio frequency circulator having first, second and third ports, said circulator first port adapted for connection to the radio frequency power source;

a radio frequency power sensor having a radio frequency input connected to said circulator second port and having a radio frequency output adapted for connection to the plasma chamber electrode, said power sensor having a signal output representative of the radio frequency power passing therethrough;

a termination resistor connected to said circulator third port, said resistor dissipating reflected power and harmonics from the plasma chamber electrode; and a power controller connected to said sensor signal output, wherein said power controller is adapted to control the radio frequency power source so as to maintain a desired radio frequency power at the plasma chamber electrode.

5. The plasma processing system of claim 4, further comprising a fixed matching network between the second port of said circulator and the radio frequency input of said power sensor.

6. A plasma processing system including a radio frequency power source and plasma chamber having a radio frequency electrode, said system comprising:

an adjustable matching and parameter selection network having an input and an output, said network input adapted for connection to the radio frequency power source;

a radio frequency parameter sensor having a radio frequency input connected to the output of said network and having a radio frequency output adapted for connection to the plasma chamber electrode, said parameter sensor having a plurality of signal outputs representative of the radio frequency power passing therethrough, the plasma chamber electrode voltage, current, phase angle between the voltage and current, direct current bias, harmonic content and impedance; and a controller connected to said sensor signal outputs, wherein said controller is adapted to control the radio frequency power source so as to maintain a desired radio frequency power at the plasma chamber electrode, set said network to a pre-established impedance match between the plasma chamber and power source, control the current and voltage parameters at the plasma chamber electrode, and prevent unwanted process and matching conditions.

7. The plasma processing system of claim 6, further comprising:

a radio frequency circulator connected between the radio frequency power source and said network, said circulator having first, second and third ports, wherein the first port is adapted for connection to the radio frequency power source and the second port is connected to the input of said network; and a termination resistor connected to said circulator third port, said resistor dissipating reflected power and harmonics from the plasma chamber electrode.

8. The plasma processing system of claim 6, wherein said controller is a programmable computer system.

9. The plasma processing system of claim 6, wherein said controller controls the plasma mode.

10. A plasma processing system including a plurality of radio frequency power sources and plasma chamber having a plurality of radio frequency electrodes, said system comprising:

a plurality of radio frequency circulators each having first, second and third ports, each first port of said plurality of circulators adapted for connection to a respective radio frequency power source;

a plurality of radio frequency power sensors connected between each second port of said plurality of circulators and each of the plurality of radio frequency electrodes, each of said plurality of power sensors having a signal output representative of the radio frequency power passing therethrough;

a plurality of termination resistors connected to each third port of said plurality of circulators, said termination resistors dissipating power reflected from the respective plasma chamber electrode; and a power controller connected to said plurality of sensor signal outputs, wherein said power controller is adapted to control the plurality of radio frequency power sources so as to maintain a desired process parameter at the plasma chamber electrode.

11. A plasma processing system including a radio frequency power source and plasma chamber having a radio frequency electrode, said system comprising:

first, second and third radio frequency parameter sensors each having a plurality of signal outputs representative of the radio frequency power passing therethrough, voltage, current, phase angle between the voltage and current, impedance, harmonic content and direct current bias;

a first adjustable matching network for adjusting the impedance to the radio frequency power source;

a second adjustable parameter network for controlling the plasma chamber E-field and H-field modes;

said first sensor connected between the radio frequency power source and said first matching network;

said second sensor connected between said first matching network and said second parameter network;

said third sensor connected between said second parameter network and the plasma chamber electrode; and a controller connected to said first, second and third sensor signal outputs, wherein said controller is adapted to control the radio frequency power source so as to maintain a desired radio frequency power at the plasma chamber electrode, set said first and second networks to pre-established impedance matches between the plasma chamber and power source, control the current and voltage parameters at the plasma chamber electrode, and prevent unwanted process and matching conditions.

12. A plasma processing system of claim 11, wherein said controller is a computer system having a software program that calculates the match conditions of said first and second networks thereby controlling the desired process parameters of the plasma chamber.

13. A plasma processing system of claim 11, further comprising:

first and second circulators, and first and second termination resistors, said first and second termination resistors are connected to said first and second circulators, respectively;

said first circulator is connected between said first sensor and said first matching network; and said second circulator is connected between said second sensor and said second parameter network.

* * * * *